United States Patent
Nomura et al.

(10) Patent No.: US 6,464,466 B1
(45) Date of Patent: Oct. 15, 2002

(54) TRAP APPARATUS

(75) Inventors: Norihiko Nomura, Fujisawa; Nobuharu Noji, Zushi, both of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/706,694

(22) Filed: Nov. 7, 2000

(30) Foreign Application Priority Data

Nov. 10, 1999 (JP) .......................................... 11-319364

(51) Int. Cl.⁷ .............................................. F04F 11/00
(52) U.S. Cl. ...................................................... 417/48
(58) Field of Search ............................ 417/48, 50, 51, 417/49, 52, 322; 75/255; 96/108; 252/181.1; 118/715, 723

(56) References Cited

U.S. PATENT DOCUMENTS

| | | | |
|---|---|---|---|
| 4,468,468 A | * 8/1984 | Benninghoven et al. | 250/288 |
| 5,053,244 A | * 10/1991 | Kieser et al. | 427/162 |
| 5,211,913 A | * 5/1993 | Hagiwara et al. | 422/102 |
| 5,616,246 A | * 4/1997 | Gagnon et al. | 204/240 |
| 5,695,640 A | * 12/1997 | Tseng | 210/490 |
| 5,980,213 A | 11/1999 | Krueger et al. | 417/51 |
| 6,045,618 A | * 4/2000 | Raoux et al. | 118/715 |
| 6,132,515 A | * 10/2000 | Gauthier | 118/715 |
| 6,152,905 A | * 11/2000 | Osborn et al. | 604/370 |
| 6,187,072 B1 | * 2/2001 | Cheung et al. | 118/715 |
| 6,193,802 B1 | * 2/2001 | Pang et al. | 118/715 |
| 6,197,119 B1 | * 3/2001 | Dozoretz et al. | 118/715 |

FOREIGN PATENT DOCUMENTS

| | | |
|---|---|---|
| EP | 0 603 782 A2 | 6/1994 |
| EP | 0 648 861 A1 | 4/1995 |
| EP | 0 839 930 A1 | 5/1998 |
| EP | 0 847 789 A1 | 6/1998 |
| EP | 0 847 790 A1 | 6/1998 |
| JP | 58-106186 | 6/1983 |
| JP | 11-230035 | 8/1999 |
| WO | WO99/37919 | 7/1999 |

* cited by examiner

Primary Examiner—Teresa Walberg
Assistant Examiner—Daniel Robinson
(74) Attorney, Agent, or Firm—Armstrong, Westerman & Hattori, LLP (57) ABSTRACT

A trap apparatus is provided for improving the efficiency of trapping a product or the efficiency of regenerating the trap unit, i.e., the efficiency of removing the product deposited on the trap unit. The trap apparatus is disposed in a discharge path for evacuating a hermetically sealed chamber through a vacuum pump. The trap apparatus comprises a trap unit for depositing thereon a product contained in a discharged gas and removing the product, and the trap unit has a surface which has been subjected to hydrophilization treatment.

7 Claims, 7 Drawing Sheets

TRAP APPARATUS

BACKGROUND OF THE INVENTION

1. Field of the Invention

The present invention relates to a trap apparatus for use in an evacuating system for evacuating a vacuum chamber for a semiconductor fabrication apparatus or the like.

2. Description of the Related Art

Figure 7:
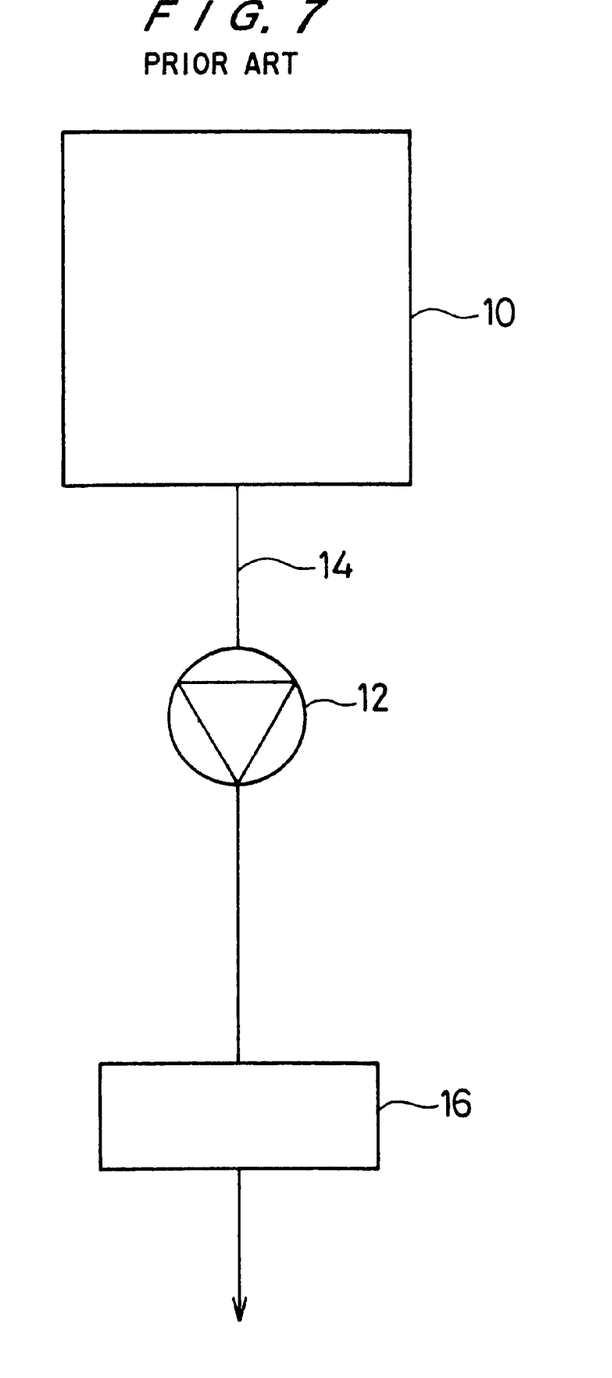
FIG. 7 is a system diagram showing a conventional evacuation system.

A conventional evacuating system will be described below with reference to FIG. 7. In FIG. 7, a hermetically sealed chamber 10 comprises a process chamber for use in a semiconductor fabrication process such as an etching apparatus or a chemical vapor deposition (CVD) apparatus. The hermetically sealed chamber 10 is connected to a vacuum pump 12 through a discharge path 14. The vacuum pump 12 serves to increase the pressure of gases discharged from the process in the hermetically sealed chamber 10 to an atmospheric pressure. An oil-sealed rotary vacuum pump has heretofore been used as the vacuum pump. A dry pump is mainly used as the vacuum pump at present.

If the degree of vacuum required by the hermetically sealed chamber 10 is higher than the ultimate vacuum of the vacuum pump 12, then an ultra-high vacuum pump such as a turbo-molecular pump is additionally disposed upstream of the vacuum pump 12.

Gases discharged from some processes are toxic and/or explosive depending on the type of the process, and hence cannot be directly released into the atmosphere. Therefore, a discharged gas treatment apparatus 16 is provided downstream of the vacuum pump 12.

Among gases, discharged from the process, whose pressures are increased to an atmospheric pressure, gas components that cannot directly be discharged into the atmosphere are treated by a process such as adsorption, decomposition, or absorption. Only harmless gases are discharged from the discharged gas treatment apparatus 16 into the atmosphere. Necessary valves are provided at appropriate locations of the discharge path 14.

The conventional evacuating system has the following disadvantages.

In the conventional evacuating system, if reaction by-products contain a substance having a high sublimation temperature, then the gas of the substance is solidified while its pressure is being increased, and deposited in the vacuum pump 12. This tends to cause a failure of the vacuum pump.

For example, when $BCl_3$ or $Cl_2$ which is a typical process gas for aluminum etching is used, the remainder of the process gas of $BCl_3$ or $Cl_2$ and a reaction by-product of $AlCl_3$ are discharged from the hermetically sealed chamber 10 by the vacuum pump 12. $AlCl_3$ is not deposited at the suction side of the vacuum pump 12 because its partial pressure is low. However, while $AlCl_3$ is being discharged under pressure, its partial pressure rises to cause $AlCl_3$ to be deposited, solidified and attached to the inner wall of the vacuum pump 12, resulting in a failure of the vacuum pump 12. The same problem occurs with reaction by-products such as $(NH_4)_2SiF_6$ and $NH_4Cl$ that are produced in a CVD apparatus for depositing films of SiN.

It has heretofore been attempted to heat the vacuum pump wholly to pass the reaction by-products in gaseous state through the vacuum pump so that no solid substance is deposited in the vacuum pump. This attempt has been effective to prevent a solid substance from being deposited in the vacuum pump. However, it has been problematic in that a solid substance is deposited in the discharged gas treatment apparatus disposed downstream of the vacuum pump, thereby clogging a filled layer in the discharged gas treatment apparatus.

Therefore, it is conceivable that a suitable trap apparatus such as a low-temperature trap is provided upstream of the vacuum pump to trap components which are liable to solidify and are contained in the discharged gas. In this case, the trap apparatus is required to prevent most components contained in the discharged gas from passing therethrough without being deposited in a trap unit, thereby improving the trap efficiency and thus enhancing the reliability thereof.

Further, since trapped solids are accumulated on the trap unit of the trap apparatus, after the elapse of a certain period of time, the replacement of the trap unit or the removal of the solids by a predetermined method to regenerate the trap unit is required. In the former, a large number of trap units should be provided, and it is difficult to automate the operation of the system. An example of a possible method for realizing automatic operation is to provide a regeneration chamber adjacent to the trap chamber. In this method, the trap unit is positioned within the regeneration chamber, and, in this state, a regeneration liquid, such as hot water or a chemical liquid, heated to a predetermined temperature is allowed to flow through the regeneration chamber to regenerate (clean) the trap unit, thus making it possible to perform automatic operation. In this case, it is required to improve regeneration efficiency and enhance the reliability of the trap apparatus.

SUMMARY OF THE INVENTION

The present invention has been made in view of the above drawbacks. It is therefore an object of the present invention to provide a trap apparatus which can improve its reliability by virtue of the improved efficiency of trapping products, or the improved regeneration efficiency, i.e., the improved efficiency of removing products deposited on the trap unit to regenerate the trap unit.

In order to achieve the above object, according to one aspect of the present invention, there is provided a trap apparatus disposed in a discharge path for evacuating a hermetically sealed chamber through a vacuum pump, the trap apparatus comprising: a trap unit for depositing thereon a product contained in a discharged gas and removing the product, the trap unit having a surface which has been subjected to hydrophilization treatment.

The hydrophilization of the trap unit on its surface makes the surface energy smaller than the condensation force of a liquid. By virtue of this treatment, even a product, which is difficult to be trapped, is likely to be adsorbed on the surfaces of baffle plates, thus improving the trap efficiency. Examples of hydrophilization treatment include fluorocoating with hydrophilic ions incorporated therein.

According to another aspect of the present invention, there is provided a trap apparatus comprising: a trap chamber disposed in a discharge path for evacuating a hermetically sealed chamber through a vacuum pump, the trap chamber housing a trap unit for depositing thereon a product contained in a discharge gas and removing the product; a regeneration chamber disposed adjacent to the trap chamber for introducing a regeneration liquid to regenerate the trap unit; and a switching mechanism for switching the trap unit between the trap chamber and the regeneration chamber, the trap unit having a surface which has been subjected to water repellent treatment.

The water repellent treatment of the trap unit on its surface suppresses the surface energy, and can facilitate the condensation of a liquid. This prevents spreading of the liquid on the surfaces of the trap unit, and can easily repel the liquid. Therefore, even if baffle plates having a complicated shape are used to improve the trap efficiency in the trap unit, when the baffle plates are regenerated with a regeneration liquid, the regeneration liquid can be easily repelled from the surfaces of the baffle plates. This can improve the efficiency of washing and drying, i.e., the regeneration efficiency, and consequently can improve the operating efficiency, and thus the trap efficiency. An example of water repellent treatment is coating of a fluororesin such as tetrafluoroethylene polymer.

The above and other objects, features, and advantages of the present invention will be apparent from the following description when taken in conjunction with the accompanying drawings which illustrates preferred embodiments of the present invention by way of example.

DETAILED DESCRIPTION OF THE PREFERRED EMBODIMENTS

A trap apparatus according to embodiments of the present invention will be described with reference to the accompanying drawings. Like or corresponding parts are denoted by like or corresponding reference numerals throughout views.

Figure 1:
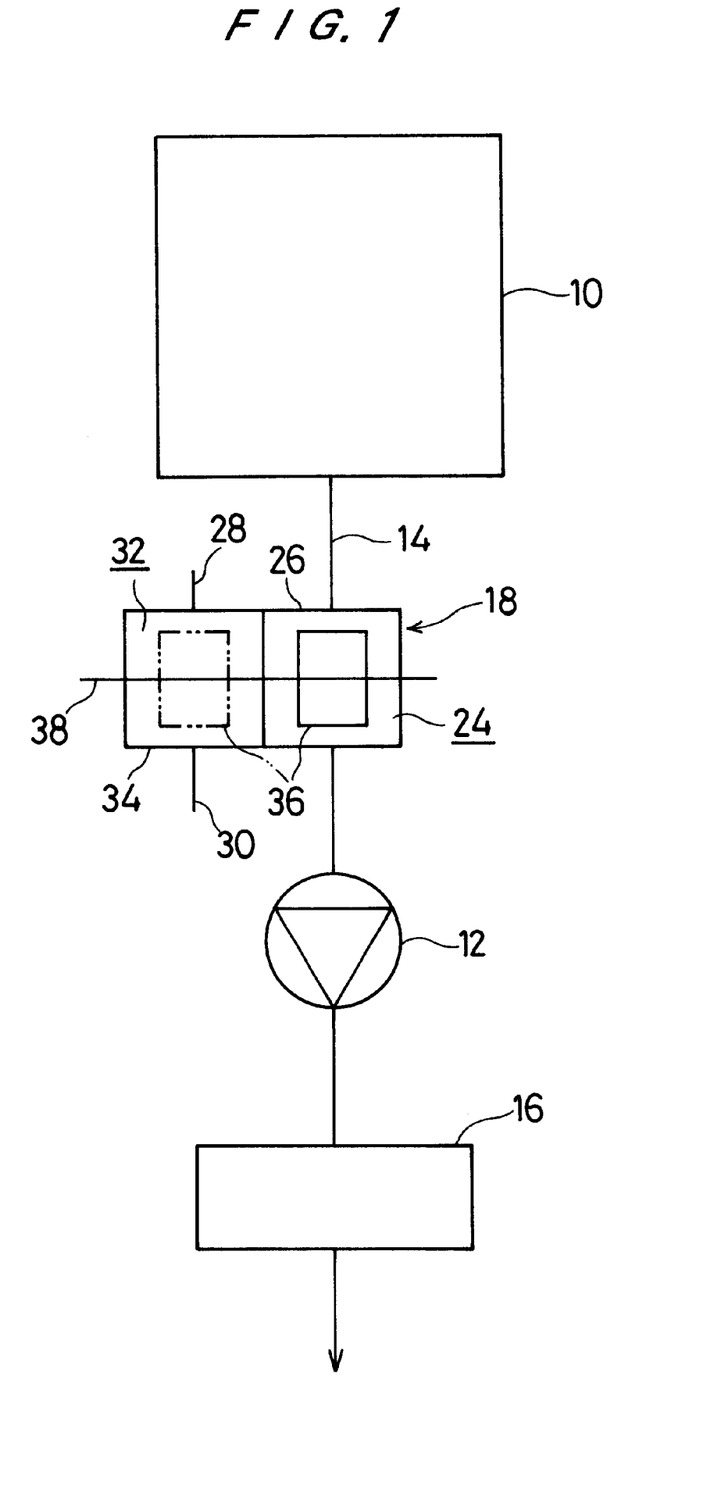
FIG. 1 is a system diagram showing an evacuation system having a trap apparatus according to a first embodiment of the present invention.
Figure 2:
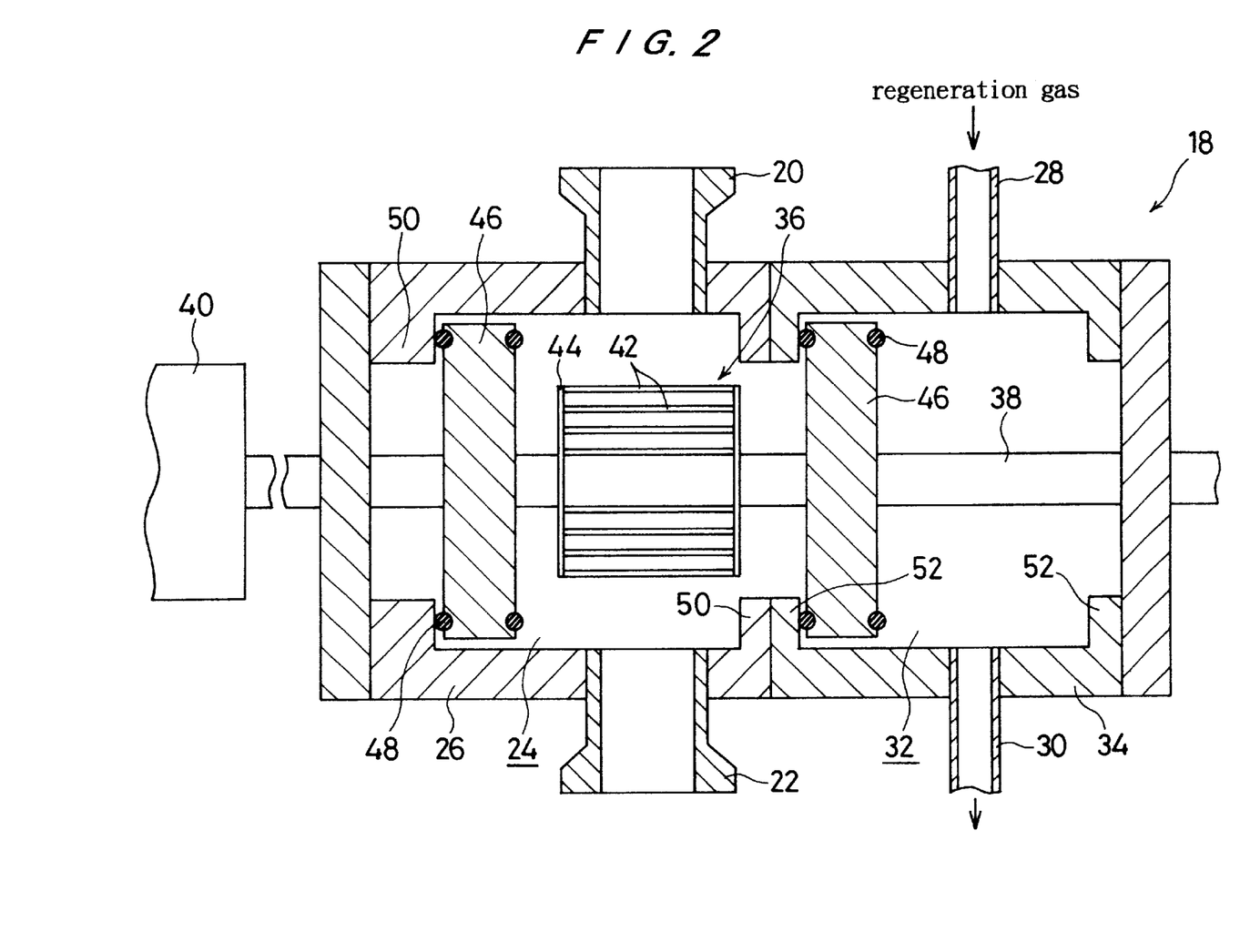
FIG. 2 is a vertical cross-sectional view of the trap apparatus shown in FIG. 1.
Figure 3:
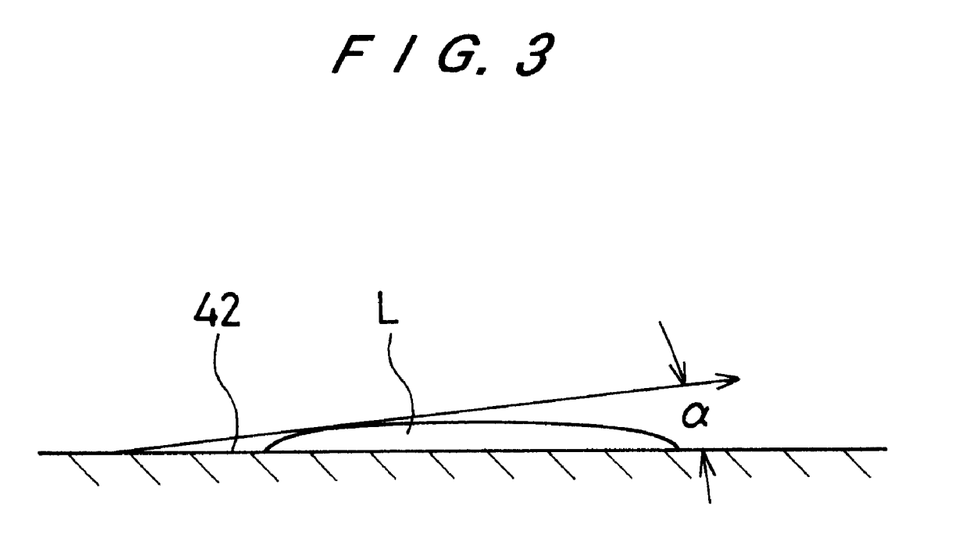
FIG. 3 is a diagram illustrating the function of a baffle plate which has been subjected to hydrophilization treatment.

FIGS. 1 through 3 show a trap apparatus according to a first embodiment of the present invention. According to this embodiment, a discharge path 14 is provided for evacuating a hermetically sealed chamber 10 constituting a part of a semiconductor fabrication apparatus by a vacuum pump 12. A trap apparatus 18 is provided upstream of the vacuum pump 12. The trap apparatus 18 comprises a trap container 26 constituting a trap chamber 24 having a suction port 20 and a discharge port 22 communicating with the discharge path 14. The trap apparatus 18 further comprises a regeneration container 34 constituting a regeneration chamber 32 adjacent to the trap chamber 24, and the regeneration chamber 32 has a regeneration gas introduction port 28 and a regeneration gas discharge port 30.

A shaft 38 on which the trap unit 36 is mounted is disposed so as to pierce through both of the containers 26, 34. This shaft 38 is constructed so as to be reciprocated by means of an air cylinder 40 as a switching mechanism in its axial direction, thus allowing the trap unit 36 to be alternately moved between the trap chamber 24 and the regeneration chamber 32. The trap unit 36 comprises baffle plates 42 mounted around the shaft 38 through end plates 44. The shaft 38 has a passage (not shown) therein, for allowing a low-temperature fluid to pass therethrough to cool the baffle plates 42 through the end plates 44.

The baffle plates 42 have surfaces which have been hydrophilized, for example, by coating of a fluororesin having hydrophilic ions incorporated therein. This makes the surface energy smaller than the condensation force of a liquid. Consequently, as shown in FIG. 3, the contact angle α between the surface of the baffle plate 42 and a liquid L becomes small, and hence the area of contact of the surface of the baffle plate 42 with the liquid L becomes large, and the liquid L is liable to be attached to the surface of the baffle plate 42.

A pair of valve elements 46, 46 movable integrally with the trap unit 36 are provided on the shaft 38 at both sides of the trap unit 36 so as to sandwich the trap unit 36 therebetween, and are positioned respectively within the trap chamber 24 and the regeneration chamber 32. O-rings 48 as a sealing member are mounted respectively on both sides of the valve elements 46, 46 in their peripheral edge portions. The O-ring 48 can be brought into pressure contact with one of partition walls 50, 50 projecting inwardly from both ends of the trap container 26 and with one of partition walls 52, 52 projected inwardly from both ends of the regeneration container 34, whereby the trap chamber 24 and the regeneration chamber 32 are sealed.

Next, the operation of the trap apparatus 18 having the above construction will be described below. While semiconductor devices are manufactured, switching is made so that the trap unit 36 is positioned within the trap chamber 24, and the baffle plates 42 are cooled with a coolant. This permits a specific component, such as aluminum chloride in the case of the formation of an aluminum film, contained in a discharged gas flowing into the trap chamber 24 through the discharge path 14 to be trapped as solid matter and removed from the discharged gas. At that time, since the baffle plates 42 in the trap unit 36 have been applied to the hydrophilization treatment, the surface energy is smaller than the condensation force of a liquid. Therefore, even a product such as a condensate with Si or the like, which is difficult to be trapped, can be positively adsorbed onto the surfaces of the baffle plates 42, thus improving the trap efficiency.

As soon as a temperature sensor, a pressure sensor or the like detects that the trapped product has reached a certain amount, the processing is temporarily stopped, or alternatively switching is made to other discharge trap path, and then the trap unit 36 is moved into the regeneration chamber 32. Thereafter, a regeneration gas is introduced into the regeneration chamber 32 through the introduction port 28, and discharged through the discharge port 30, whereby the trap unit 36 is regenerated.

Figure 4:
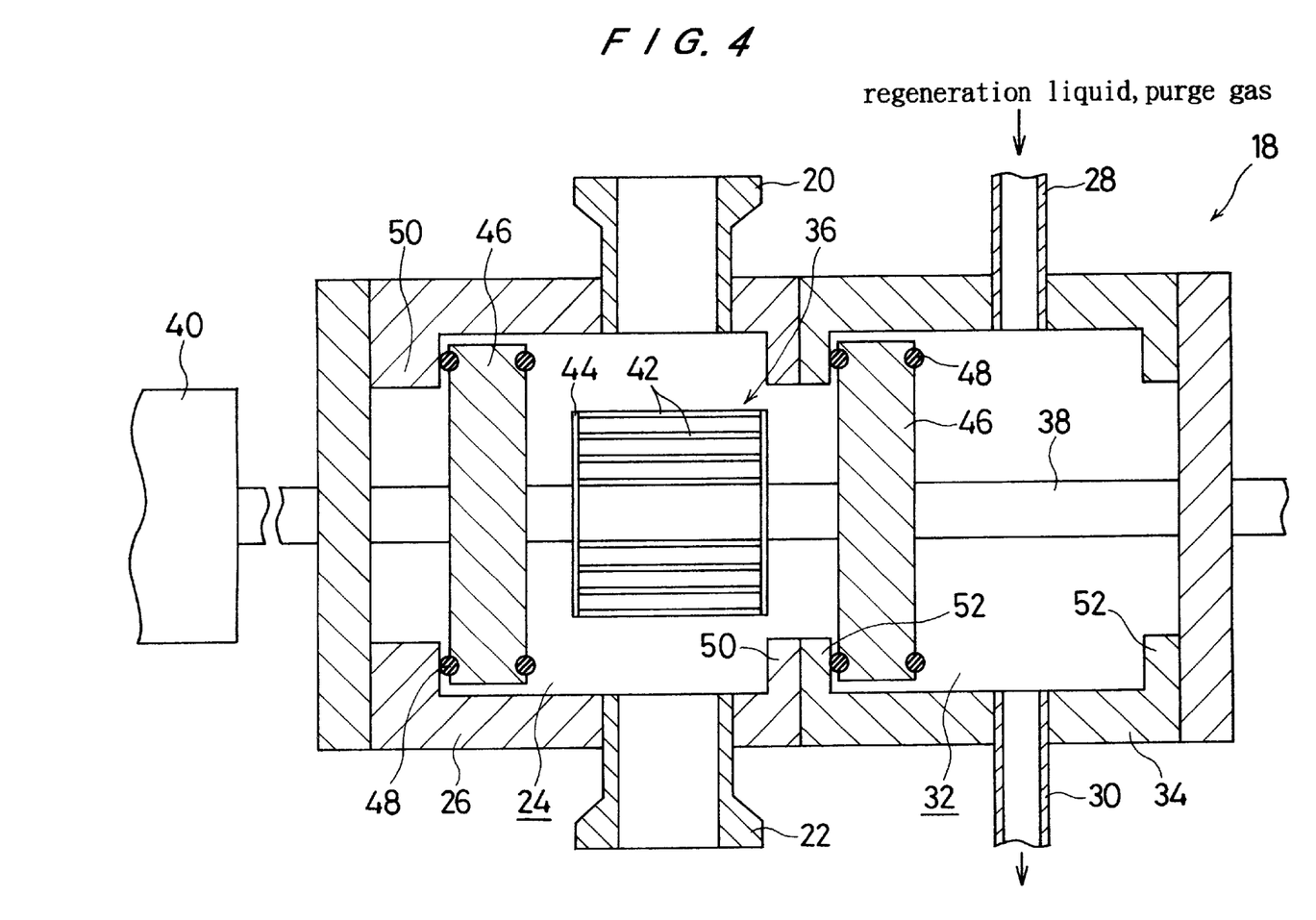
FIG. 4 is a vertical cross-sectional view of the trap apparatus according to a second embodiment of the present invention.
Figure 5:
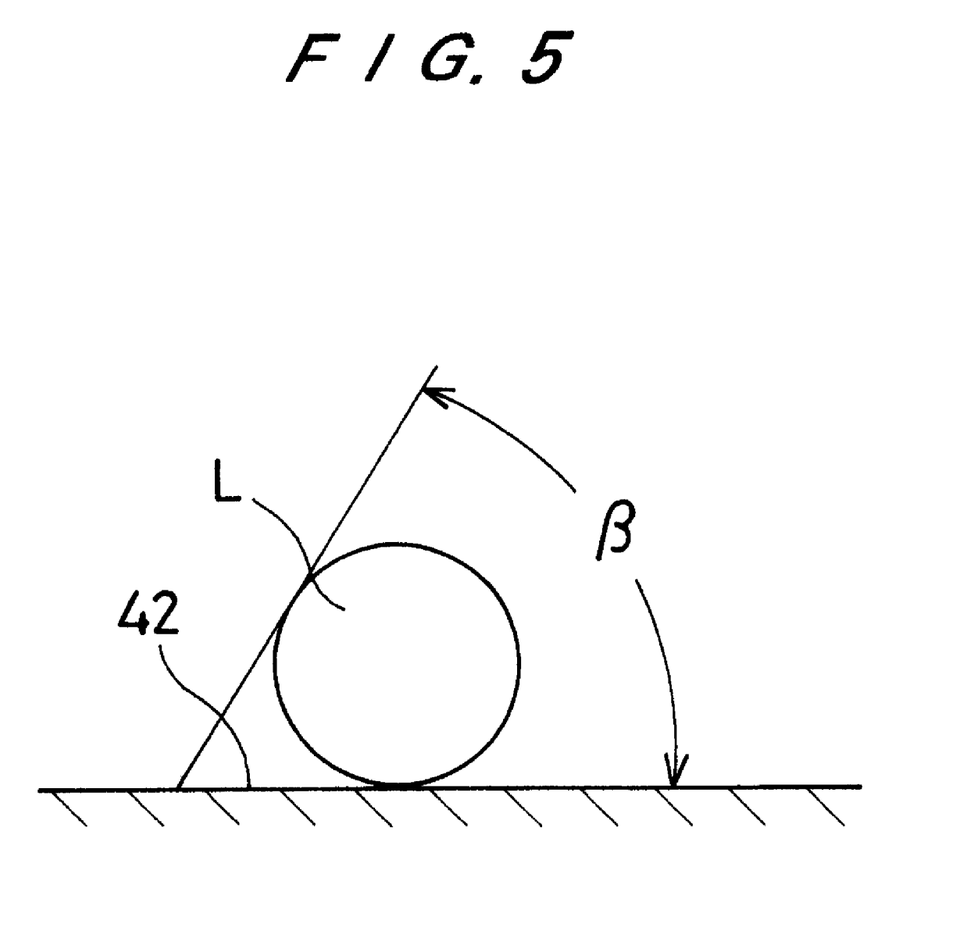
FIG. 5 is a diagram illustrating the function of a baffle plate which has been subjected to water repellent treatment.

FIGS. 4 and 5 show the trap apparatus according to the second embodiment of the present invention. According to this embodiment, the surfaces of the baffle plates 42 in the trap unit 36 have been subjected to water repellent treatment, for example, by coating of a fluororesin such as tetrafluoroethylene polymer, and a regeneration liquid such as warm water or a chemical liquid, and purge gas can be introduced through the introduction port 28 into the regeneration chamber 32 in a controlled manner. The other construction is the same as that of the first embodiment of the present invention.

Since the water repellent treatment is applied to the surfaces of the baffle plates 42, the surface energy is suppressed, and a liquid is liable to condense. Therefore, the liquid is not spreaded on the surface of the baffle plate 42, and is easily repelled from the surface. More specifically, as shown in FIG. 5, the contact angle β between the surface of the baffle plate 42 and the liquid L becomes large, and the surface of the baffle plate 42 is brought into point contact with the liquid L, thus allowing the liquid L to be easily repelled from the surface of the baffle plate 42.

In this embodiment, it is detected that the trapped product has reached a certain amount, the processing is temporarily stopped, or alternatively switching is made to other discharge trap path, and then the trap unit 36 is moved into the regeneration chamber 32. Thereafter, a regeneration liquid is introduced through the introduction port 28 into the regeneration chamber 32 to immerse the trap unit 36 in the regeneration liquid. Thus, the product deposited onto the baffle plates 42 in the trap unit 36 is dissolved in the regeneration liquid, or otherwise is separated from the baffle plates 42 by the force of flow of the regeneration liquid to allow the separated product to float in the regeneration liquid. The regeneration liquid containing the product dissolved therein or floating therein is successively discharged through the discharge port 30.

Upon the completion of the regeneration of the trap unit 36 in this manner for a predetermined period of time, purge gas such as dry $N_2$ gas is introduced into the regeneration chamber 32 through the introduction port 28, and then discharged through the discharge port 30 to dry the trap unit 36 and the regeneration chamber 32. Thereafter, the trap unit 36 is returned into the trap chamber 24. In this connection, it should be noted that the baffle plates 42 in the trap unit 36 are applied to the water repellent treatment, and hence the surface energy is suppressed to allow the liquid to easily condense. Therefore, at the time of the regeneration of the baffle plates 42 with the regeneration liquid, the regeneration liquid is easily repelled from the surfaces of the baffle plates 42, thus improving the efficiency of washing and drying, and the efficiency of regeneration.

This embodiment is best suited for use in trapping of a product such as $SiO_2$ compound, which is easy to be trapped in the trap unit, but difficult to be removed from the trap unit in the step of regenerating the trap unit. A lowering in trap efficiency can be compensated for by forming a trap unit into a complicated shape to increase the area of contact of the baffle plates with the discharged gas.

Figure 6A:
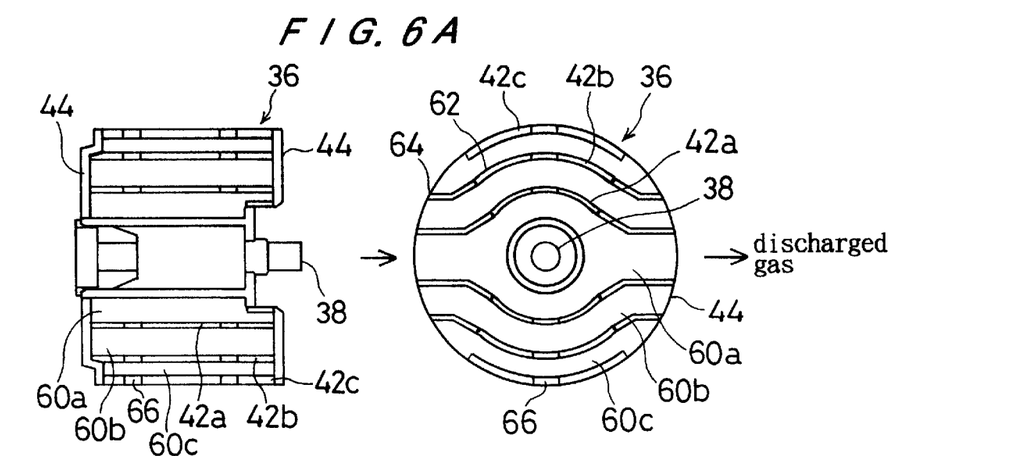
FIGS. 6A, 6B and 6C are diagrams showing different trap units best suited for use in the trap apparatus according to the second embodiment of the present invention.

FIGS. 6A, 6B and 6C show trap units best suited for use in this embodiment. In FIG. 6A, a plurality of baffle plates 42a, 42b, 42c (6 baffle plates in total in the embodiment shown in the drawing) are provided symmetrically with respect to the left and right directions. Trap passages 60a, 60b, 60c are provided between adjacent baffle plates and between the baffle plate and the shaft 38. The baffle plates 42a, 42b, 42c have concentric arc sections 62 and linearly and parallel extended flat sections 64, and each of the baffle plates 42a, 42b, 42c is provided with a discharge hole 66.

Figure 6B:
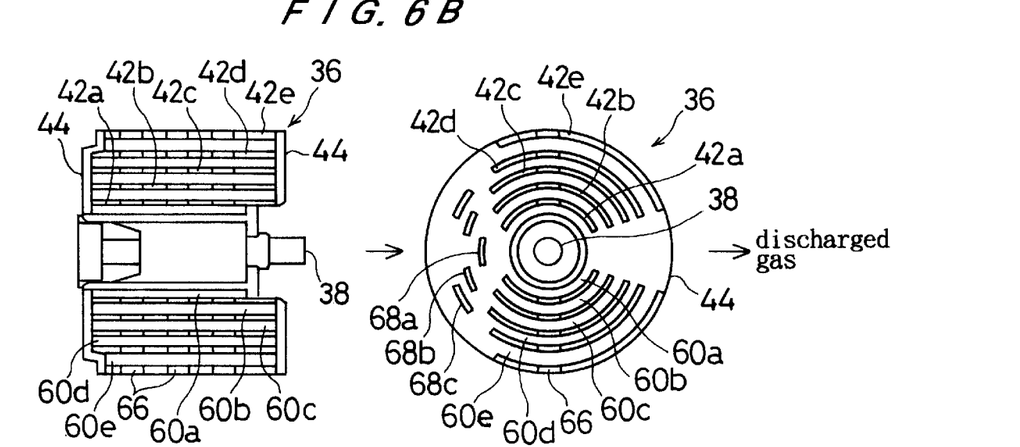

FIG. 6B shows an embodiment in which a plurality of arc-shaped baffle plates 42a, 42b, 42c, 42d and 42e are disposed so as to surround the shaft 38, and curved trap passages 60a, 60b, 60c, 60d and 60e are constructed in a multi-layer form between the baffle plate 42a and the shaft 38, and between these baffle plates 42a, 42b, 42c, 42d and 42e. The width of the inlet on the upstream side of each of the passages is constructed so as to be widened at a more obtuse angle than the width of the outlet, and guide baffles 68a, 68b and 68c serving to distribute gas flowing on the central portion to the peripheral passages are provided on the inlet side.

Figure 6C:
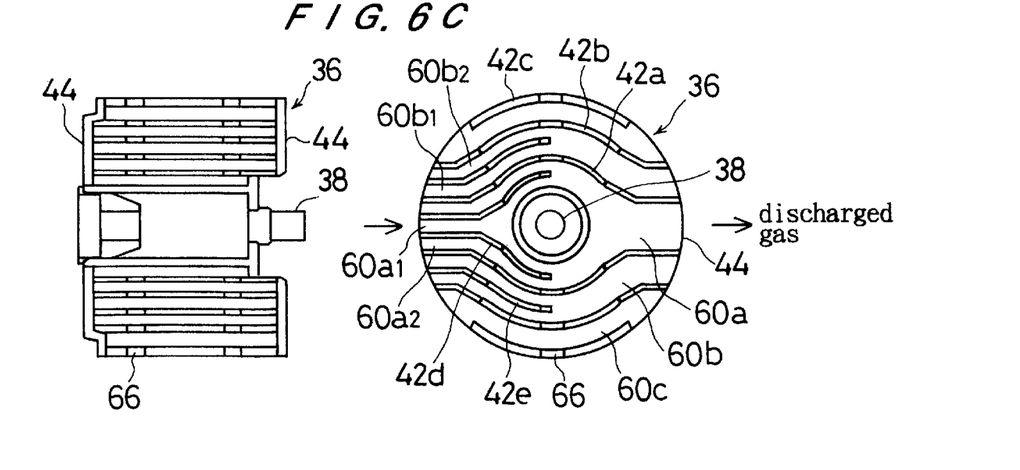

FIG. 6C shows an embodiment in which other baffle plates 42d, 42e are disposed only on the upstream side of a portion between the baffle plates 42a, 42a and a portion between the baffle plates 42a, 42b, shown in FIG. 6A, so that the upstream side of the passage 60a is divided into two passages 60a1, 60a2 through the baffle plate 42d and the upstream side of the passage 60b is divided into two passages 60b1, 60b2 through the baffle plate 42e.

An attempt to regenerate (wash) the trap unit 36 having the complicated shape as described above with a regeneration liquid and to dry the regenerated trap unit 36 results in the entry of the regeneration liquid into gaps between the baffle plates, and the need for a lot of time for drying. The water repellent treatment of the baffle plates can improve the efficiency of washing and drying.

As is apparent from the foregoing description, the present invention can improve the efficiency of trapping products or the efficiency of removing products deposited on the trap unit, i.e., the efficiency of regenerating the trap unit. Therefore, if the present invention is applied to an evacuation system for semiconductor processing apparatuses or the like, then the apparatuses can be stably operated to thus improve reliability thereof. Thus, it is possible to prolong the service life of vacuum pumps, protect devices for removing harmful substances, improve the reliability of operation through a reduction in loss time, and reduce equipment and/or operation costs.

Although certain preferred embodiments of the present invention have been shown and described in detail, it should be understood that various changes and modifications may be made therein without departing from the scope of the appended claims.

What is claimed is:

1. A trap apparatus disposed in a discharge path for evacuating a hermetically sealed chamber through a vacuum pump, said trap apparatus comprising:

a trap unit for depositing thereon a product contained in a discharged gas and removing the product, said trap unit comprising baffle plates each having a surface which has been subjected to hydrophilization treatment for absorbing the product onto the surface.

2. A trap apparatus according to claim 1, wherein said trap unit is regenerated by a regeneration gas.

3. A trap apparatus according to claim 1, wherein said product which is difficult to be trapped is trapped by said baffle plates of said trap unit.

4. A trap apparatus according to claim 3, wherein said product comprises a condensate with Si.

5. A trap apparatus comprising:

a trap chamber disposed in a discharge path for evacuating a hermetically sealed chamber through a vacuum pump, said trap chamber housing a trap unit for depositing thereon a product contained in a discharge gas and removing the product;

a regeneration chamber disposed adjacent to said trap chamber for introducing a regeneration liquid to regenerate said trap unit; and a switching mechanism for switching said trap unit between said trap chamber and said regeneration chamber;

wherein said trap unit comprises baffle plates each having a surface which has been subjected to water repellent treatment for absorbing the product onto the surface.

6. A trap apparatus according to claim 5, wherein said product which is easy to be trapped, but difficult to be removed is trapped by said baffles of said trap unit.

7. A trap apparatus according to claim 6, wherein said product comprises $SiO_2$ component.

* * * * *